United States Patent [19]

Kawakami et al.

[11] Patent Number: 4,885,431
[45] Date of Patent: Dec. 5, 1989

[54] PRINTED CIRCUIT BOARD

[75] Inventors: Shin Kawakami; Satoshi Haruyama; Hirotaka Okonogi; Katutomo Nikaido; Norito Mukai, all of Saitama, Japan

[73] Assignee: Nippon CMK Corp., Saitama, Japan

[21] Appl. No.: 174,835

[22] Filed: Mar. 29, 1988

[30] Foreign Application Priority Data

Sep. 19, 1987 [JP] Japan ................................ 62-235766

[51] Int. Cl.4 .............................................. H05K 1/00
[52] U.S. Cl. ...................................... 174/68.5; 174/36
[58] Field of Search ........................... 174/34, 36, 68.5

[56] References Cited

U.S. PATENT DOCUMENTS

| Re. 27,089 | 3/1971 | Sear et al. | 174/36 X |
|---|---|---|---|
| 3,391,454 | 7/1968 | Reimann et al. | 174/68.5 |
| 3,461,524 | 8/1969 | Lepselter | 174/68.5 |
| 3,613,230 | 10/1971 | Griff | 174/68.5 X |
| 3,837,074 | 9/1974 | Griff | 174/68.5 X |
| 4,673,904 | 6/1987 | Landis | 174/36 X |
| 4,707,671 | 11/1987 | Suzuki et al. | 174/36 X |
| 4,725,478 | 2/1988 | Mathias et al. | 174/68.5 X |
| 4,739,453 | 4/1988 | Kurokawa | 174/68.5 X |
| 4,816,616 | 3/1989 | Jones | 174/68.5 |

Primary Examiner—Morris H. Nimmo
Attorney, Agent, or Firm—Bruce L. Adams; Van C. Wilks

[57] ABSTRACT

Outer surface of a printed circuit board having circuit conductors on one or both surfaces may be covered by shield film or layer to shield outer noise from reaching the circuit conductors. To shield cross talk and noise from reaching each other, all electrically exposed surfaces of the circuit conductors are covered also by shield film.

6 Claims, 2 Drawing Sheets

PRINTED CIRCUIT BOARD

BACKGROUND OF THE INVENTION

The present invention relates to a printed circuit board.

A conventional printed circuit is shown in FIG. 3, and is formed on a copper clad laminated plate by etching the copper film on the plate to form a desired circuit conductor 2 on a base plate 1.

To shield outer noise from reaching the circuit conductors 2 on the printed circuit board 3, before desired instruments are attached to on the printed circuit board 3. Shield film 4 having a shielding function is placed on the board 3 to locally shield a portion or portions where outer noise is to be prevented from reaching circuit components. In FIG. 3, 5 designates an insulation layer which overlays the circuit conductors 2.

Conventionally, the shield film 4 on the printed circuit board 3 is made as a separate member, and is cut to desired dimension before the film is placed on the printed circuit board 3. The applicant of the present invention proposes an improved printed circuit board shown in FIG. 4, having a shield layer which can be formed industrially in the course of making the printed circuit board.

The known printed circuit board 6 shown in FIG. 4 is formed such that after the circuit conductor 2 is formed on the base plate 1, an insulating layer 5 is formed, and on the insulating layer 5 paste having a shielding function is printed by a silk screen printing process, and then the paste is hardened to form shield layer 7. Then, an insulating layer 8 is formed on the shield film 7.

The printed circuit boards 3 and 6 are each formed by forming shield film 4 or shield layer 7 on the circuit conductor 2 so that outer noise can be shielded from the conductor 2. However, cross talk or noise effect between the conductors 2 can not be effectively shielded.

The present invention aims to eliminate such drawbacks and to provide an improved printed circuit board having no cross talk and noise effect between conductors and from the outside environment.

SUMMARY OF THE INVENTION

According to the present invention, a printed circuit board forming circuit conductors on one or both sides of a base plate is characterized in that all electrically exposed surfaces of the circuit conductors are covered by shield films.

According to a preferred embodiment of the present invention outer surface of the shield film is covered by an added shield layer.

By the shield film covering the exposed surfaces of the circuit conductors, cross talk and noise between the conductors can be completely eliminated.

Also, outer noise is shielded from reaching a circuit conductor completely by forming a second shield layer to the outer surface of the circuit conductors.

DETAILED DESCRIPTION OF THE PREFERRED EMBODIMENTS

Figure 1:
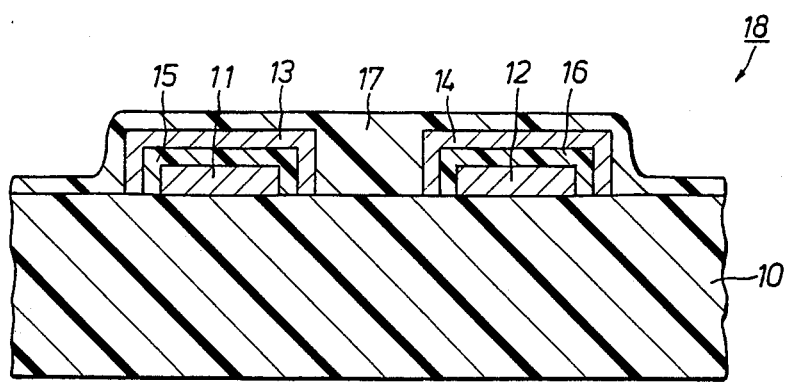
FIG. 1 is a sectional view of a portion of the printed circuit board, according to the present invention.

Preferred embodiments of the printed circuit board, by way of example, will be described referring to the drawings.

FIG. 1 is a sectional view showing a first embodiment of the present invention. In FIG. 1, 10 designates a base plate on which circuit conductors 11 and 12 are formed.

All the surfaces of the circuit conductors 11 and 12 are covered by insulating layers 15 and 16, and then the insulating layers are covered by shield films 13 and 14. As shown, the ends of the shield films 13 and 14 reach to the surface of the base plate so that all exposed surfaces of the circuit conductors 11 and 12 are electrically covered by the shield films 13 and 14.

Then, insulating layer 17 covers the shield films 13 and 14 to complete a printed circuit board, according to the present invention.

In the above described printed circuit board 18, as the all exposed surfaces of all circuit conductors 11 and 12 are covered individually by the shield films 13 and 14, cross talk and noise between the conductors are prevented and also the outer noise effect is prevented by the shield function of the shield films 13 and 14.

To produce, the shield films 13 and 14, a known paste having a shielding function is printed on the circuit conductors by, e.g., a silk screen printing process, and the paste is hardened to form the shield films.

Figure 2:
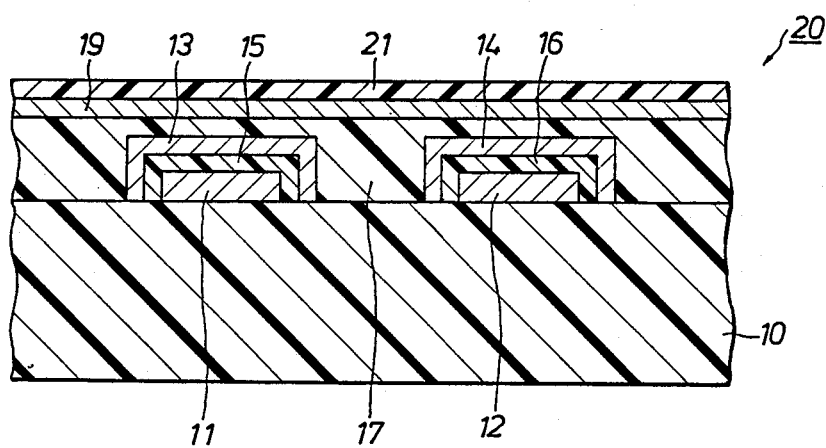
FIG. 2 is a sectional view of a portion of the printed circuit board, according to a second embodiment of the invention.
Figure 3:
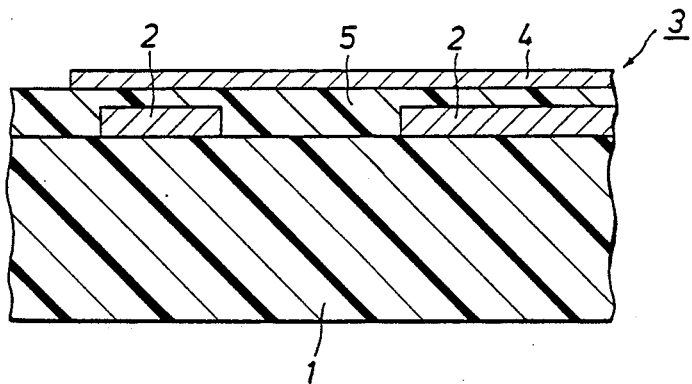
FIGS. 3 and 4 are sectional views of known printed circuit boards.
Figure 4:
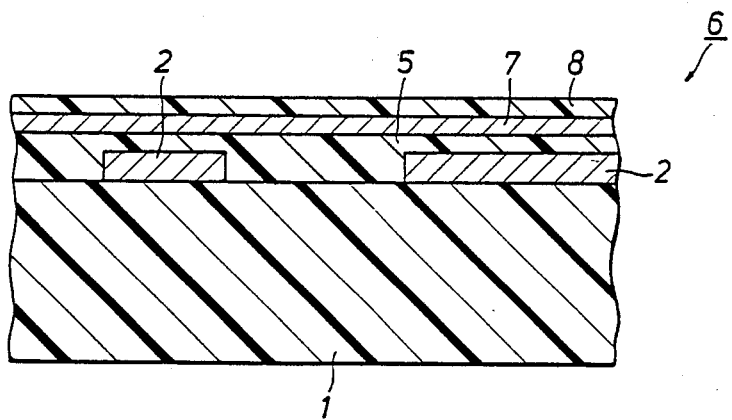

FIG. 2 shows a second embodiment of the printed circuit board according to the present invention.

The printed circuit board 20 shown in FIG. 2 is formed by adding a shield film 19 to the insulating layer 17 of the printed circuit board 18 shown in FIG. 1.

The shield film 19 can be produced by printing paste having a shielding function by, e.g., silk screen printing process and drying the paste.

On the shield film 19, an insulating layer 21 is formed. Other construction of the printed circuit board 20 is similar to that of the printed circuit board 18 shown in FIG. 1, and the same reference numeral is used to show the same or a similar part or portion.

The above described printed circuit board 20 attains all functional effect of the printed circuit board 18 shown in FIG. 1, and also, an outer noise effect to the circuit conductors 11 and 12 is completely prevented by the added shield film 19.

As described in detail, the printed circuit board, according to the present invention, prevents cross talk and noise between circuit conductors, and also shields outer noise effectively from reaching the circuit conductors.

We claim:

1. A printed circuit board comprising:
   a base plate having opposed major surfaces;
   electrically conductive elements formed on at least one major surface of said base plate;
   an insulating layer formed directly on and covering all electrically exposed surfaces of each respective electrically conductive element;
   a shield film formed over all exposed surfaces of each respective insulating layer to effectively shield the electrically conductive elements from external electric noise; and
   another insulating layer formed on and covering all exposed surfaces of the shield films and the exposed surface of said one major surface of said base plate.

2. A printed circuit board according to claim 1; further comprising electrically conductive elements mounted on the other major surface of said base plate; an insulating layer formed directly on and covering all electrically exposed surfaces of each respective electrically conductive elements formed on the other major surface; and a shield film formed over all exposed surfaces of each respective aforesaid insulating layers.

3. A printed circuit board according to claim 1; further comprising another shield film formed over said another insulating layer and extending over the first-mentioned shield films.

4. A printed circuit board according to claim 3; further comprising another insulating layer formed directly on and covering the exposed surface of said another shield film.

5. A printed circuit board according to claim 1; wherein the electrically conductive elements are formed directly on the one major surface of said base plate.

6. A printed circuit board according to claim 1; wherein said shield films are composed of a hardened paste material.

* * * * *